United States Patent [19]

Agrawal et al.

[11] 4,272,648

[45] Jun. 9, 1981

[54] GAIN CONTROL APPARATUS FOR DIGITAL TELEPHONE LINE CIRCUITS

[75] Inventors: Bhagwati P. Agrawal, Shelton; Kishan Shenoi, Fairfield, both of Conn.

[73] Assignee: International Telephone and Telegraph Corporation, New York, N.Y.

[21] Appl. No.: 98,110

[22] Filed: Nov. 28, 1979

[51] Int. Cl.³ .............................................. G06F 7/39
[52] U.S. Cl. ................................ 179/1 VL; 179/81 R; 364/745
[58] Field of Search ................ 179/1 VL, 1 HF, 1 H, 179/18 FA, 170 R, 16 F, 81 R; 370/113; 375/98; 364/757, 745

[56] References Cited

U.S. PATENT DOCUMENTS

| 3,594,565 | 7/1971 | Ragen | 364/745 |
| 3,997,770 | 12/1976 | Claasen et al. | 364/757 |
| 4,034,196 | 7/1977 | Butterweck et al. | 364/745 |

OTHER PUBLICATIONS

R. Kieburtz, "Rounding and Truncation Limit Cycles", IEEE Trans. on Acoustics, Sp. an Sig. Proc., Feb. 1974, p. 73.

Primary Examiner—Charles E. Atkinson
Assistant Examiner—E. S. Kemeny
Attorney, Agent, or Firm—John T. O'Halloran; Jeffrey P. Morris

[57] ABSTRACT

There is disclosed a digital gain control particularly adapted for use with digital signals propagating in a telephone line circuit. The gain control is positioned in the circuit to respond to a digital signal manifesting a plurality of words, each having a given number of bits N and indicative of a weighted value of an analog signal. The digital signal is multiplied by a word coefficient having a number of bits M indicative of a gain factor to be imparted to the digital signal. A product signal is provided containing M+N bits. The least significant bits are removed to provide an output signal of N bits possessing the desired gain. The discarded bits are employed via a feedback loop and are added to the next word product, which is then used to provide a next output signal. The feedback loop assures that each output signal is a close approximation to the input signal as gain controlled by the desired gain factor.

23 Claims, 5 Drawing Figures

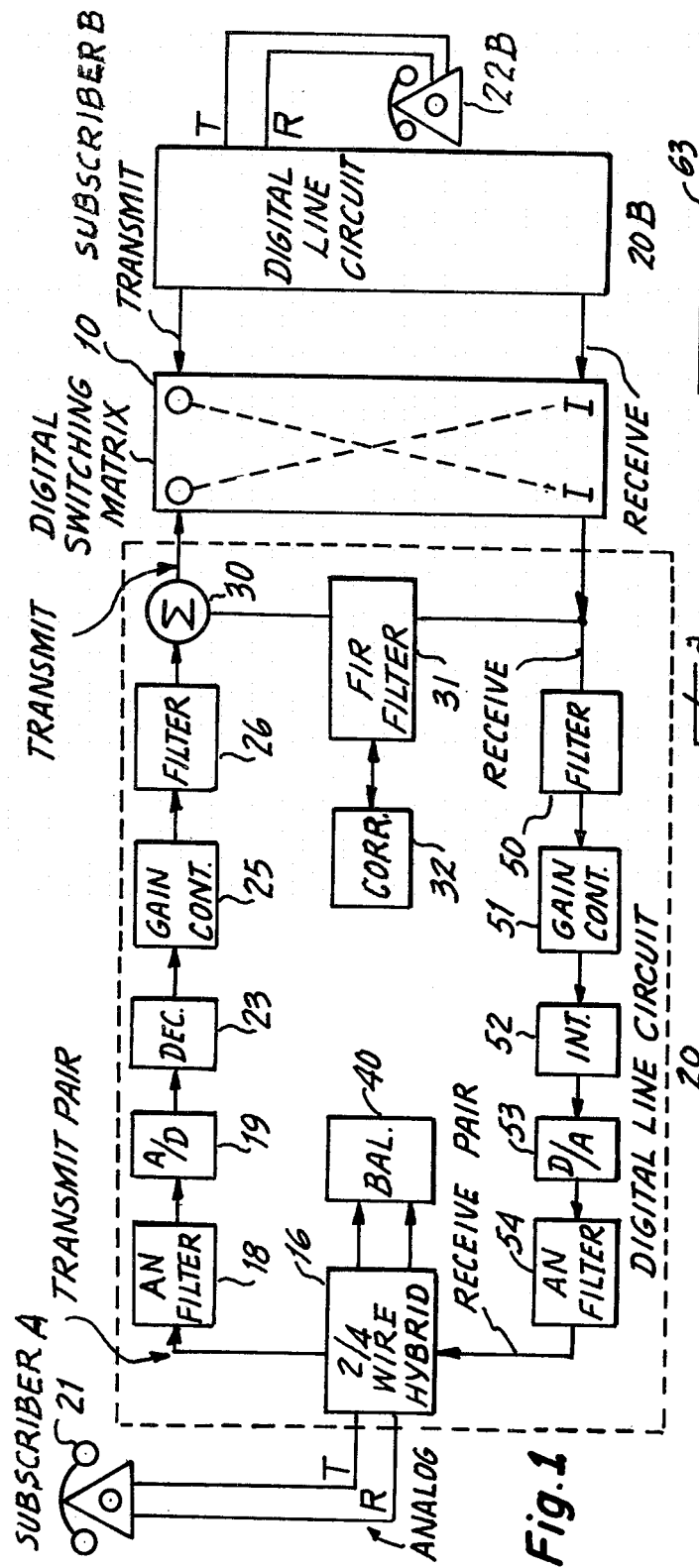
Fig. 1
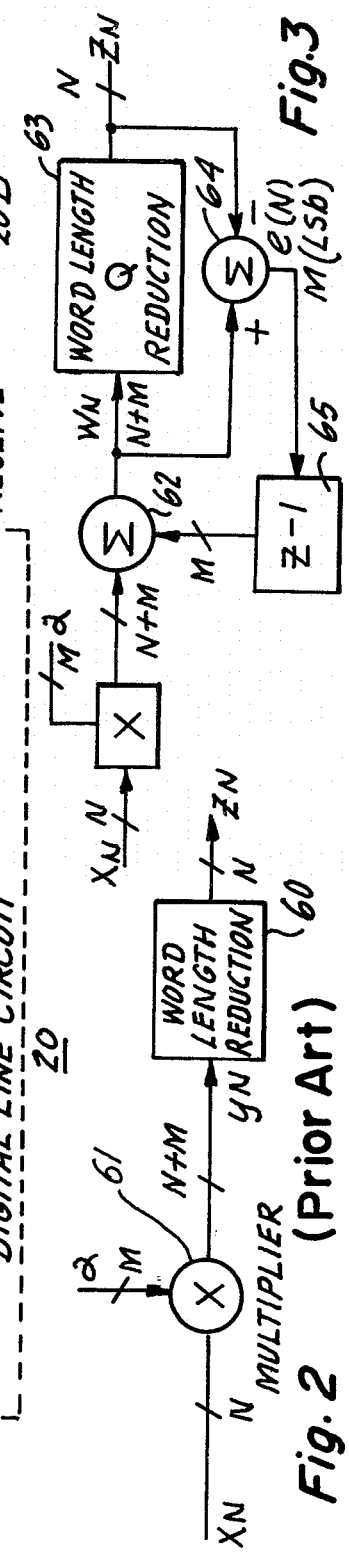
Fig. 2 (Prior Art)
Fig. 3

GAIN CONTROL APPARATUS FOR DIGITAL TELEPHONE LINE CIRCUITS

FIELD OF INVENTION

The present invention generally relates to digital telephone line circuits, and more particularly to a gain control device for use in conjunction with a digital telephone line circuit.

BACKGROUND OF THE INVENTION

In transmission systems for communications, of which the telephone switching system is an example, there is a need for gain control. Gain control is accomplished in the line circuit associated with a subscriber or a trunk and enables the system user to optimize the line circuit according to a subscriber's preferences or requirements.

Basically, a subscriber's opinion of the grade of transmission in a communications system depends upon many factors, such as the received acoustic pressure, which is a function of the efficiency of the transmitter and receiver and of the electrical loss between them, the frequency response of the network as to the bandwidth, and amplitude and delay distortion, the noise as to the amount of noise and the character of the noise, the crosstalk, the echo as to magnitude and delay. In general, the transmission system should be flexible and adapted to provide the user with the most efficient and reliable transmission and reception that can be accommodated within the bounds dictated by technology and in conformity with his expectations.

In this respect, gain control is a desirable feature to be used in a line circuit as it enables greater flexibility of operation to enable a subscriber to be accommodated according to such expectations. Gain control may be employed for level adjustment in a line circuit, as well as affording improvement, by proper adjustment, of certain types of interferences. Thus, undesirable effects arising from echoes, and "singing" can be improved or reduced by the use of gain control in the line circuit. Such effects are usually caused or arise partly from impedance mismatching and gain control offers an effective improvement.

It is, of course, understood that the design and implementation of a line circuit is a prime consideration in the design of a telephone switching system as in a communications transmission system. Each subscriber in a telephone system has a separate line circuit and hence, any additional circuitry in a line circuit significantly increases the cost of the entire system. As one can imagine, a single switching system may have, for example, 100,000 subscribers and hence, 100,000 line circuits, as compared to common control components as the network control, the switching matrix and so on.

While implementation of gain control is extremely desirable in a line circuit, it must be accommodated as inexpensively as possible and of course, must provide the above noted advantages. Gain control can be employed and implemented in both the analog and digital paths of a switching system and techniques for both are known. In the system to be described, the subscriber transmits and receives an analog signal but the signal processed by the line circuit for transmission and reception via the switching matrix is a digital signal. If one implemented gain control on the analog signal, one would substantially increase the number of line circuit components. Furthermore, analog gain control requires matched, high quality precision components which are expensive. If the components are not matched, one does not achieve fine gain resolution (0.1 db or better) and therefore, many of the advantages of gain control are not provided.

It is thus an object of the present invention to provide gain control in a telephone line circuit, which control operates a on digital signal. The gain control apparatus to be described requires inexpensive components as compared to analog techniques, while affording high accuracy and resolution over an effective control range.

The digital implementation to be described allows the components used to be implemented with integrated circuit technology and hence, the gain control and other components can be fabricated in integrated circuit boards which can accommodate large amounts of digital hardware.

DESCRIPTION OF THE PREFERRED EMBODIMENT

A gain control for a digital signal of the type comprising a plurality of digital words, each having the same number of bits with each word manifesting a weighted value of an analog signal, comprising multiplier means having one input responsive to said digital signal, and a second input adapted to receive a digital coefficient word indicative of a desired gain factor to be imparted to each of said words, said coefficient word having a predetermined number of bits, to provide at an output of said multiplier means, a digital product signal having a number of bits equal to the sum of said coefficient word bits and said digital word bits, logic means responsive to said product signal for obtaining at an output, an output signal having a number of bits equal to said word bits, said means operative to remove all of said least significant bits in said product signal not corresponding to said word bits, whereby said output signal contains the same number of bits as said digital word with each of said words multiplied by said gain factor, summing means responsive to said output signal and said removed least significant bits and operative to provide an error signal indicative of said least significant bits, control means responsive to said error signal and the product signal obtained from the next digital word to add said error signal to said product signal to provide a compensated digital signal having the same number of bits as any of said product signals, said control means including means for applying said compensated signal to said logic means, to cause said means to provide said output signal for words in said digital signal as compensated by said error signal.

BRIEF DESCRIPTION OF THE DRAWINGS

Above-mentioned and other features and objects of this invention will become more apparent by reference to the following description taken in conjunction with the accompanying drawings, in which:

FIG. 1 is a simplified block diagram of a digital line circuit employed in a digital telephone switching system;

FIG. 2 is a simplified block diagram of a digital gain control apparatus according to the prior art;

FIG. 3 is a simplified block diagram of digital gain control apparatus according to this invention;

DETAILED DESCRIPTION OF INVENTION

Figure 4:
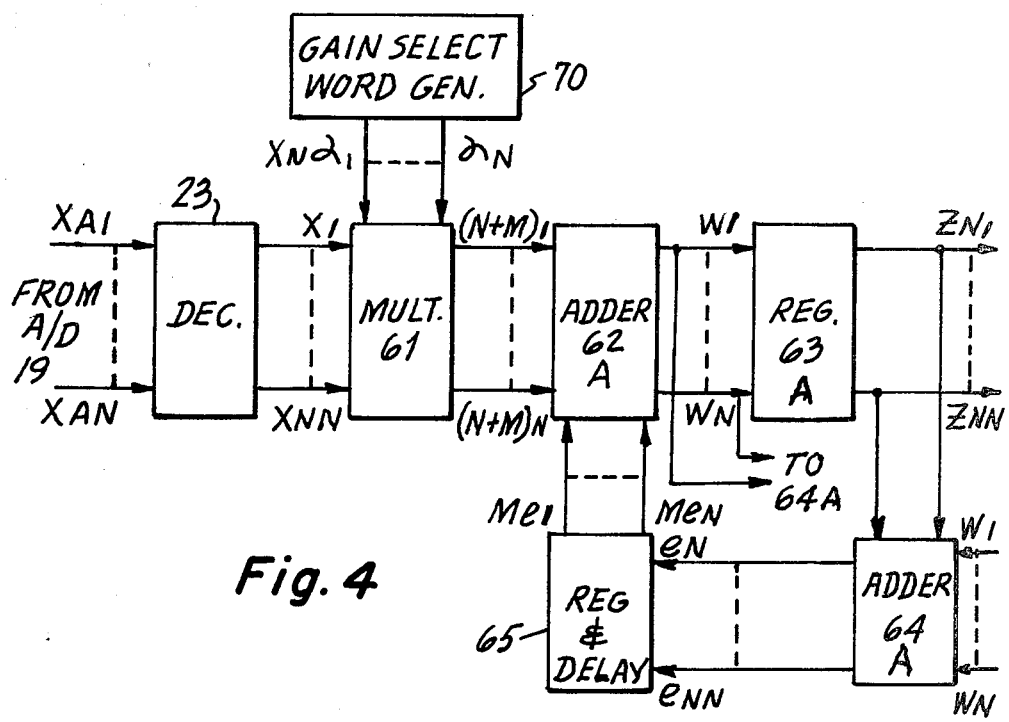
FIG. 4 is a block diagram depicting the circuit components for parallel operation of a digital gain control.

Referring to FIG. 1, there is shown a simplified diagram of a telephone communications system employing digital and analog signal paths.

Essentially, a single subscriber A is connected via a digital switching matrix 10 to another subscriber B. Each subscriber as A has a separate line circuit 20 associated with his subset and to enable communications between the parties. While subscribers A and B are shown associated with subsets as 21 and 22, it is understood that the subscribers could be trunk locations for connecting to other central offices and so on and as such, would also require a line circuit as 20. In order to simplify the explanation, a single line circuit 20 is shown for subscriber A and it is understood that subscriber B has an identical line circuit 20B as does the plurality of additional subscribers not shown in FIG. 1.

For an example of a digital line circuit employed in a switching system, reference is had to U.S. Pat. No. 4,161,633 entitled SUBSCRIBER LINE/TRUNK CIRCUIT issued on July 17, 1979 to Robert Treiber and assigned to the International Telephone and Telegraph Corp., the assignee herein. As will be explained, the gain control circuit to be described has applicability in such line circuits as employing digital signals.

The telephone subset 21 associated with subscriber A is coupled via a two-wire analog line including tip (T) and ring lines (R) to a two-to-four wire hybrid or converter circuit 16. The hybrid 16 is a well known component and essentially connects the two wire analog line to a four wire line. Hence, the output of the hybrid 16 is coupled to two wires shown as a single line and designated as a transmit pair and two wires, (single line) designated as a receive pair. A description of suitable hybrid circuits and operation may be had by referring to a text entitled REFERENCE DATA FOR RADIO ENGINEERS, Sixth Edition (1975) Howard W. Sams, pages 35-16 through 35-20. A digital hybrid circuit is described in copending U.S. patent application Ser. No. 903,458 filed on May 8, 1978 and assigned to the assignee herein.

The transmit pair via hybrid 16 is coupled to the input of an analog filter 18. As one can ascertain, the signal as propagating from the hybrid 16 through the filter 18 is an analog signal. The output of the filter 18 is coupled to the input of an analog to digital converter (A/D) 19. The analog to digital converter 19 may be a pulse code modulator (PCM) device and operates to sample and digitize the analog output signals from filter 18 to provide a digital signal at its output. While one may employ a pulse code modulated signal (PCM), other techniques for analog to digital conversion are applicable. The PCM or digital signal is provided at the output of the A/D 19. This digital signal is applied to the input of a decimator module (DEC) 23. Essentially, the decimator module 23 is a digital filter which functions to decimate or reduce the output word rate of a digital signal applied to its input. In the above discussion, it was indicated that the analog to digital converter 14 is a PCM device, but other types of A/D converters could be employed as well.

In any event, depending upon the signal, a decimator as 23 may be employed to filter or provide attenuation to the digital signal for frequencies outside the band of interest or in this case, for frequencies outside the voice band (0-4 KHz). The decimator 23 is a second order recursive filter having a low pass filter characteristic. The decimator 23 provides a signal at its output at a lower word rate than the word rate available from the analog to digital converter 19. For example, the output digital signal from the A/D converter 19 may be at a sampling frequency (fs) or a word rate of 1.024 MHz with three bits per word. The output of the decimator 23 would be at a sampling frequency (fs) or a word rate of 32 KHz with a word length of 13+ bits per word.

In order to describe the operation of the gain control circuit 25, one desires to know the word length and word rate as the operation of a digital gain control circuit as 25 may be adapted for use in other applications for the control of the gain of a digital signal. It is understood that the overall design philosophy of a line circuit is based upon the interrelation and functions of the various circuit components employed, but the gain control according to this invention may have broader application in the digital circuit field.

The output of the gain control 25 is applied via a recursive audio filter 26 to a summing network 30. The filter 26 has a bandwidth determined by the range of audio signals for transmission via the transmission path of the switching network 10. Another input to the summing network 20 is derived from an FIR filter 31. The filter 31 operates in conjunction with a correlator 32 to suppress or cancel the effects of echo in the line circuit. The operation and discussion of the echo suppression circuit has been described in detail in a copending application entitled ADAPTIVE DIGITAL ECHO CANCELLATION CIRCUIT, Ser. No. 020,593, filed on Mar. 14, 1979 for B. P. Agrawal et al and assigned to the assignee herein. The output of the summer 30 is applied to the switching matrix 40 where it is directed when a connection is made by the switching system to the receive input of a called subscriber as B. The subscriber's line circuit 20B is identical to the line circuit 20 shown for subscriber A. Hence, as can be ascertained, the digital output signal from the transmit output (O) of the line circuit 20 of subscriber A is applied via the digital switching matrix 10 to the receive input (I) of the line circuit 20B. Examples of digital switching matrices as 10 can be had by referring to a copending application entitled MULTIPORT DIGITAL SWITCHING ELEMENT, Ser. No. 888,582, filed on Mar. 17, 1978 for A. J. Lawrence et al now U.S. Pat. No. 4,201,890 issued May 6, 1980 and assigned to the assignee herein.

The receive input (I) from the matrix 10 is coupled to the receive pair of the digital line circuit. In this manner, the digital signal from the transmit output (O) of the remote subscriber is directed to the input of a recursive audio filter 50, having the same bandpass characteristics as filter 26. The output of filter 50 is applied to the input of a gain control circuit 51 which essentially, is of the same configuration as gain control 25. The digital signal as controlled in gain at the output of gain control 51 is applied to an interpolator circuit 52. Basically, the interpolator 52 functions to increase the word rate of the digital signal.

As indicated, in the transmit path the decimator 23 will decrease the word rate to 32 KHz at 13 bits or more per word. The interpolator 52 increases the word rate to 1.024 MHz at three bits or more bits per word or to another rate determined by the sampling rate employed. The output of the interpolator 52 is applied to the input of a digital to analog converter (D/A) 53. The D/A converter 53 operates to selectively sample the digital signal at the output of the interpolator 52 to provide at an output, an analog signal, which is applied via the analog filter 54 to the hybrid 16. The use of an interpolator 52 in conjunction with an applicable type of digital to analog converter 53 is described in detail in U.S. Pat. No. 4,109,110 entitled DIGITAL TO ANALOG CONVERTER issued on Aug. 22, 1978 to M. J. Gingell and assigned to the international Standard Electric Corporation. Other types of interpolators and digital to analog converters may be employed as well. The output analog signal, as indicated, is filtered and applied to the receive port of the hybrid 16 where it is then applied to the two wire subscriber lines and hence to the subset 21.

Accordingly, the above description depicts a digital line circuit operative to process an analog signal to a digital signal in a transmit path and to convert the digital signal back to an analog signal in the receive path. The line circuit basically employs a gain control circuit 25 in the transmit path and a gain control circuit 51 in the receive path. Both gain control circuits operate on the digital signal at the same word rate and at the same bit length. As is understood from the above description, the gain control affords unique advantages for the line circuit to enable efficient communications tailored to the needs and preferences of the subscriber.

DIGITAL GAIN CONTROL

Shown coupled to the hybrid 16 is a balancing circuit 40. The function of the balancing circuit is to match the line impedance, typically 900 ohm and 2 microfarads, and the balancing circuit 40 is coupled to the balancing port of the hybrid 16. As described above, certain undesirable characteristics as echo return, "singing" as near "singing" are due mainly to impedance mismatch and hence, gain control can operate to control these adverse effects within limits, while mainly providing the ability to perform level adjustment or level alignment in the line circuit. By implementing gain control in the digital path, one can obtain accurate resolution and range control using inexpensive circuitry which is capable of being integrated as on a large scale integrated (LSI) circuit module and hence, such components can be implemented on an integrated circuit chip together with the additional digital circuitry employed in a line circuit as 20 or 20B.

The amount of hardware or circuitry required for digital implementation of gain control and the precision which can be obtained as well as the physical location of the gain control in the line circuit is determined by consideration of the following various factors, which will be explained. Among such factors are:

1—Range of gain control (in db)
2—Gain resolution (in db)
3—Gain accuracy
4—Gain-coefficient word length (in bits)
5—Sampling rate and sample word length
6—Signal level (in dbmO)
7—Type of signal (linear or companded)

Certain of the above factors are determined by system requirements, as range of gain control, signal level and output word length. For a typical system, these parameters are specified as follows:
Range of gain control, (0–6 db)
Signal level—50 dbmO, 0 dBmO
Word length—13 bits (linear)

The transmission level of any point in a transmission system is the ratio (in db) of the power of a test signal at that point to the power of a test signal at a reference point. The transmission level does not specify the absolute power in dbm (power in db relative to 1 milliwatt) or in any such other power units. It is relative only. Hence, a transmission level refers to a place, in terms of distance in db from a reference point. Hence, various abbreviations used as dBmO should be recognized as shorthand for 0-db transmission level point or OTLP. Sometimes this is referred to as dbrnO, dbaO, dbmO and even vuO where vu is the reading taken at a point in the transmission system by a vu meter.

Referring to FIG. 2, there is shown a prior art type of digital gain control In FIG. 2, $X_n$ is an N-bit input signal which is multiplied by an M-bit constant, and the multiplier output is quantized to N bits via a register or word length reduction stage 60. Essentially, the output consists of the signal $Z_n$ having words of the same number of bits N as the input signal $X_n$ multiplied by a gain factor or coefficient $\alpha$.

The configuration depicted in FIG. 2, while adequate for certain values of gain control, does not provide arbitrary values as required in a digital line circuit, nor is it capable of achieving fin resolutions or resolutions on the order of 0.1 db. Similarly, the circuit cannot provide gain accuracy within ten percent or less. These factors are extremely important in a transmission system and in particular, in a telephone transmission system due to the fact that if gain control is not maintained within such tolerances, one can experience numerous problems relating to gain distortion and hence, gain control can actually worsen system performance if these parameters are not accurately maintained. These detrimental effects have sometimes been referred to as gain enhancement, which is an undesirable condition.

Referring to FIG. 3, there is shown a block circuit diagram of a digital gain control apparatus according to this invention. As can be seen, FIG. 3 utilizes similar terminology as FIG. 2 to indicate the input and output signals $X_n$ and $Z_n$. The signal $X_n$ is part of a digital signal comprising a plurality of words each of the same number of bits N and indicative of a weighted value of an analog signal.

Hence, a digital word $X_n$ consisting of N bits is applied to one input of a digital multiplier 61. The other input of the multiplier 61 receives a coefficient word $\alpha$ consisting of M bits, where $\alpha$ is the gain factor to be imparted to the word $X_n$ and to all words in the signal. Multipliers as 61 are well known in the art and many suitable configurations are known which are capable of multiplying digital words or signals as $X_n$ of N bits by the coefficient word or signal $\alpha$ having M bits. For examples of suitable circuits and techniques, reference is made to a text entitled ARITHMETIC OPERATIONS IN DIGITAL COMPUTERS by R. K. Richards, published by D. Van Nostrand Company, Inc. (1955), chapter 5 entitled BINARY MULTIPLICATION AND DIVISION.

As such, multiplication of two digital numbers each comprising a predetermined number of bits can be accomplished by the use of an accumulator, a simultaneous multiplier, shifting registers and various other techniques. Multiplication of binary words can be accomplished by various arithmetic techniques as 2's complement arithmetic and is all explained in the referenced text.

In any event, when one performs multiplication of $X_n$ by $\alpha$, one obtains at the output of the multiplier 61, the product ($X_n\alpha$) which is a digital word comsisting of N+M bits and having a magnitude proportional to the factor $\alpha$ associated with the coefficient input signal, determinative of the gain.

The product is applied to a first intput of a digital adder or summing circuit 62. Digital adders as 62 are also well known and many techniques exist for implementing the same. Hence, reference is made to the above noted text, chapter 4 entitled BINARY ADDITION AND SUBTRACTION.

The adder 62 constitutes part of a digital feedback loop as will be explained. The output from the adder 62 is applied to a word length reduction circuit 63. Essentially, 63 is a register which receives the M+N bit word at the output of adder 62, and provides the output signal Zn consisting of N bits or the same number of bits as the input word multiplied by the coefficient factor $\alpha$.

Referring back to the prior art circuit of FIG. 2, the word length reduction circuit 60 operates to provide the output signal Zn by simply discarding the M least significant bits. For example, assume that the input word Xn consists of four binary bits as 1111. This binary number is indicative of the decimal number 15. Assume that the coefficient word $\alpha$ contains three binary bits, defining a positive coefficient $\alpha$ of 101 (decimal 5). The multiplied binary number consists of seven bits 1001011 (decimal 75). The output word Zn is always at N bits (in this case, four) and hence, appears as 1001 ... (decimal 72). The least significant bits 011 (decimal 3) are discarded by the circuit of FIG. 2.

With the simple explanation given above, one now considers that the input number Xn is a digital number where the bits of each word Xn are indicative of the weighted value of a converted analog signal. Hence, the original number Xn manifests, for example, a sampled portion of an analog audio signal, which portion has a weighted magnitude of 15. To give this signal a gain of $\alpha$ (in this case 5), the output signal should be 75. However, the circuit of FIG. 1 provides an output of 72. This is still a good approximation, but actually specifies a gain of 4.8 and not of 5. However, if one considers that the next word Xn+1 will be treated accordingly, the circuit of FIG. 2 gives an approximate gain factor to each word by the above process. Simply stated, assume that the following word Xn+1 to be processed by the gain control of FIG. 2 is indicative of an analog sample having a weighted magnitude of 14. Hence, the Xn+1 word, simply, would be 1110 (14). This word Xn+1 when multiplied by the coefficient words $\alpha$ equal to 101 would provide a digital signal output of seven bits indicative of the decimal number 70 or binary 1000110; the last three bits are again discarded by circuit 60 and hence, the output word Zn is indicated as 1000 specifying a weighted value of 64, indicative of actual gain of 4.26.

The above simple explanation relied on the use of straight forward binary multiplication. In any event, one can employ 2's complement arithmetic in the implementation of the circuit of FIG. 2. This technique is well known and described in detail in the above text for addition, subtraction, multiplication and division of binary numbers. Employing 2's complement arithmetic gives greater flexibility and hence, one can provide a wide range of gain control including attenuation as multiplying by $\alpha$ indicative of fractions.

In the circuit of FIG. 3, the least significant bits are not discarded, but are used. The output word Zn of N bits is applied to an input terminal of a summing network 64 where it is added to the output of the summer 62. This output is coupled to the other terminal of the summing circuit 64. The summing network 64 operates to provide the signal e(n) which is the instantaneous error introduced by circuit 63 and indicative of the least significant bits M. The configuration of FIG. 3 takes the M least significant bits (Mlsb) at the sample epoch n and adds these bits to the (N+M) bit product at epoch (n+1). Mathematically, if en is the instantaneous error introduced by circuit 63, then the overall behavior of the feedback loop associated with circuit 63 provides the output signal Zn described by:

$$Zn = \alpha Xn + (en - en-1)$$

where:
en is error signal at epoch n
en-1 is the error signal at epoch n-1

The circuit of FIG. 3 uses error shaping implementation of gain control and yields extremely good results when the sampling frequency (word rate) fs is high and the digitized signal is highly correlated or of a "low pass" type such as a speech signal as would be the analog signal in a line circuit. Qualitatively, this behavior is explained as follows:

If the input signal Xn is the digital equivalent of an audio analog signal (a low pass type signal), then sampling at a high rate will imply a large correlation between adjacent signal samples. Hence, the error introduced by circuit 63 is highly correlated from sample to sample. Feeding back the error thus reduces the error energy at the output and therefore, increases the input signal range over which accurate gain tracking can occur. If, however, the signal is uncorrelated, error shaping implementation of gain control will not improve system performance.

Using the above values as employed in the simple explanation of FIG. 2, the circuit of FIG. 3 operates as follows:

Assume that at epoch n for the word Xn, that a zero signal was applied at summer 62 via the module 65. Module 65 is designated as $Z^{-1}$ and is a register for transferring the bits to be added to summer 62 at the proper level and time. Hence, the output signal wn at the summer 62 is the product signal 1001011 (decimal 75) consisting of seven bits. For simplicity, this signal at epoch n is M+N. The least significant bits being specified as M. Hence, the adder or subtractor 64 operates to subtract the output word Zn of N bits from M+N to provide an error signal at the output of the adder 64 of M+N−N=M. These bits are then afforded the proper polarity by the circuit 65 and are applied to the next product at epoch n+1. The product is derived by multiplying the next word Xn+1 by the coefficient word $\alpha$. In the simple example above, this product is 1000110 (70). Hence, added to this is a signal indicative of the M bits representative of the first error signal or bits 011. Thus, the output of the summer 62 is 10001001 (decimal 73). The reduction circuit 63 again discards the bits 001 to provide at the output 1001 ... or the binary number 72 specifying a gain of 4.8.

As will be further explained, the circuit of FIG. 3 provides extremely accurate gain control according to the number of bits in a word, and the sampling rate and should be placed in the proper optimum position in the line circuit for most efficient operation.

The implementation of the circuit of FIG. 3 is relatively simple and should be understood by those skilled in the art. In any event, the signal Xn as available in the line circuit of FIG. 1 as the output from the decimator module 23 consists of parallel bits, although serial transfers could be employed.

FIG. 4 shows the parallel scheme and further should indicate the simplicity of the circuitry and components which lend themselves to integration by employing large scale (LSI) integrated circuit components.

The decimator 23 receives parallel inputs XA1 to XAn from the analog to digital converter 19. The bits XA1 to XAn may be three or more and as will be explained, in one particular case, are 3. It is important to note that the gain control circuity is purposely positioned and located after the decimator 23 as this is the most optimum location for the same. The decimator 23 provides at an output the word Xn consisting of bits X1 to Xnn. The function of the decimator 23 being to decrease the word rate available at the output of the A/D converter 19. The bits X1 to Xnn representative of a word as Xn are applied to the parallel input multiplier 61 as are the bits $\alpha 1$ to $\alpha n$ indicative of the gain coefficient word $\alpha$. The desired gain is selected by means of the word generator 70. Generator 70 may comprise a multiple stage register wherein each stage can be set to determine the gain coefficients or gain bits $\alpha 1$ to $\alpha n$. The word generator 70 is synchronized to the word rate of the decimator 23 so that synchronous multiplication can be achieved. The output of multiplier 61 is shown as bits $(N+M)n$ indicative of the product bits $M+N$. The product bits are applied to a parallel adder 62A which is equivalent to the summer 62 of FIG. 3. The adder 62A provides the output bits W1 to Wn indicative of the error corrected product applied to the word length reduction circuit 63. As can be ascertained from FIG. 3, this module is a register which receives bits W1 to Wn of a number having $M+N$ bits and provides at the output at the same weighting lines, bits Zn1 to Znn which are N bits in number. These bits therefore appear with the correct weighting values and correspond directly to the weighting values X1 to Xn at the output of the decimator 23, but differ in value according to the multiplication factor. The bits Zn to Znn are applied to adder 64, which receives the W1 to Wn bits to provide at its output, the error bits en to enn indicative of the least significant bits (M). These bits or error signals are delayed by one word interval equal to epoch n and added to the next product word via adder 62 and in proper sign and magnitude.

It should thus be apparent that the system depicted can lend itself to all types of digital arithmetic operations, as straight binary implementation, 2's complement and so on.

It is also seen that the least significant bits for gain control by positive factors of greater than one can be retrieved directly from register 63 by directly accessing those stages storing the least significant bits. These bits can then be directly added to the next word product via register and delay 65. It should be clear that all such circuitry can easily be controlled by a suitable clock generator as is known in the digital art to assure proper data transfer and control.

The circuit shown in FIGS. 3 and 4 is capable of operating in a digital line circuit within extremely stringent tolerances.

The amount of hardware required to implement digital gain control depends upon the coefficient word length ($\alpha$), sampling rate (input word rate) and the structure or model. The coefficient word length is dictated by the desired resolution or smallest gain step. The sampling rate determines the physical location of the digital gain control. Hence, as will be explained, the gain control 25 follows the decimator 23 (FIG. 1) in the transmit path, while the gain control 51 precedes the interpolator 53 in the receive path.

Essentially, the gain control circuit as shown in FIG. 3 and FIG. 4 is particularly suitable for providing gain control on a 13 bit PCM signal. The signal can be a companded signal or a coded signal, but gain control of a 13 bit linear PCM is desirable as this rate and signal is compatible with techniques employed in advanced digital telephone switching systems as evidenced by certain of the patents referred to above.

Figure 5:
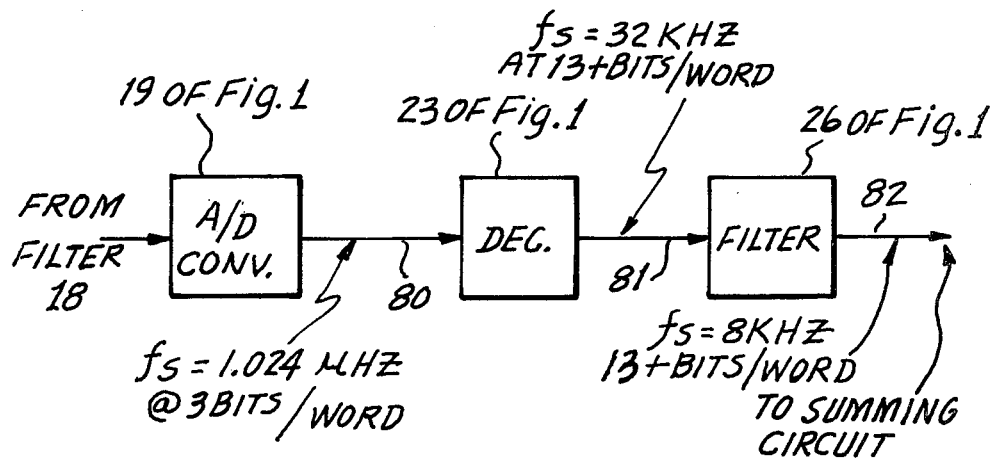
FIG. 5 is a simple block diagram useful in explaining the operation and location of a digital gain control in a digital telephone line circuit.

Referring to FIG. 5, there is shown a portion of the line circuit 20 of FIG. 1 with particular values selected to describe the word rate, the word length and so on.

There are three possible locations for positioning the digital control circuit shown in FIGS. 3 and 4 in the path depicted in FIG. 5. One possible location 80 is at the output of the A/D converter 19. Another location 81 is at the output of the decimator 23 and a third possibility is at the output 82 of the audio filter circuit 26.

In any event, the locations 80, 81 and 82 for providing gain control on a linear PCM signal, differ in sampling frequency and word size used to represent the input samples. At location 80, the sampling rate is selected at 1.024 MHz at three bits per word. At location 81, the sampling rate is 32 KHz at 13+ bits per word. At location 82, the output of the audio filter, the rate is 8 KHz at 13+ bits per word.

Hence, with the above rates, it is seen that the number of additions per second needed for gain control is as follows:

Location 80: $3.072 \times 10^6$ additions/sec.
Location 81: $0.416 \times 10^6$ additions/sec.
Location 82: $0.104 \times 10^6$ additions/sec.

For example, at location 81, the output of the decimator 81, the number of additions per second (equivalent to 32 K samples per second) will be $32 \times 13$ K or $0.416 \times 10^6$. The word size at the output 80 is only 3 or at most 4 bits per word, in contrast to 13+ bits per word at an 8 KHz sampling rate at location 82.

It would appear from FIG. 5 that gain control would be simpler to implement at the output 8 of the A/D converter due to the small word size. The small word size is obtained by using the high sampling rate (1 MHz) and shaping the quantizing noise such that the noise power in the speech band (0–4 KHz) is low.

However, due to the high sample rate, one has to consider performing $3.072 \times 10^6$ additions per second. While all circuitry used can be integrated, circuit complexity is still a problem, but one must also select a location for gain control by considering whether the system requirements on gain tracking can be met.

In the circuit arrangement depicted in FIG. 2, it becomes clear that the gain cannot be implemented exactly because of the finite word length. Hence, it is necessary to round, truncate or otherwise reduce the $(M+N)$ bit product of the N bit sample and the M bit coefficient to N bits at the output. This produces discrepancies between the actual and desired gains as described. In FIG. 2, the realized or effective gain is greatly influenced by the word length reduction circuit 60. This can be done quite simply by truncation. If Xn and Yn, the signal samples are interrupted as integers and the coefficient $\alpha$ has a binary fraction, the output Yn can be written as:

$$Y_n = \alpha X_n + e_n$$

with:

1 (en)1 < 1 en = instantaneous error

If 2's complement arithmetic is used and the word length is reduced by simply discarding the M least significant bits:

$$0 \leq e_n \leq 1-2^{-M}$$

In FIG. 2, since the register 60 has no "memory", the realized gain is independent of the sampling rate. However, as explained above, by using the least significant M bits which are discarded in FIG. 2, one can achieve error control in accordance with the sampling rate.

To perform gain control at the output of the A.D. converter is not warranted due to circuit complexity based on the additions per second. With locations 81 and 82 in mind, one now has to consider the system requirements:

(1) range of attenuation: 0–6 db
(2) step size: 0.1 db
(3) accuracy: 0.01 db
(4) input signal range: 45 dBmO With these ranges in mind, a coefficient word length α was selected to be at 10 bits. It is understood that with $2^{10}$ bit patterns available for the coefficient word, only 60 ($<2^6$) are actually used as:

range/resolution = 6/0.1 = 60

Since the signal range over which the realized gain meets the accuracy requirements increases with the sampling rate, the optimum location for the gain control is after the decimator 23 or at a location in a digital line circuit possessing a sampling rate between 15 to 50 KHz with a word length of 13+ bits. A range improvement of 35 db is obtained by locating the gain control 25 after the decimator, as compared to locating the control after the filter 26. Hence, with 13+ bit linear PCM samples as an input to the gain control and a word rate of 32 KHz, the above noted system requirements are met.

It should be apparent to those skilled in the art that the gain control depicted can operate with a digital signal as obtained from an analog to digital converter as 19 (FIG. 1). The A/D converter 19 converts an analog input signal which is correlated and relatively of a low pass characteristic such as voice. The input word rate to the gain control should preferably be high, as above 20 KHz. The gain control will, of course, operate with companded signals such as companded PCM signals. The location of the gain control should be at a point in the line circuit where the input digital signal is preferably at 13+ bits with a sampling rate of 32 KHz or within the ranges specified above.

The gain is typically measured and specified as a square root of the output signal power to input signal power and many mathematical relationships for the theoretical gain and the effective gain can be employed to positively prove the superior operation of the digital gain control employed in FIGS. 3 and 4 and as above described.

It will be apparent to those skilled in the art upon reading this specification that additional embodiments, modifications and applications will be discerned and as such, are deemed to be included within the spirit and scope of the invention as particularly set forth by the claims appended hereto.

We claim:

1. A gain control circuit for operating on a digital input signal of the type comprising a plurality of digital words each having the same number of bits with each word manifesting a weighted value of an analog signal, said circuit comprising:

multiplier means having one input responsive to said digital input signal, and a second input adapted to receive a digital coefficient word indicative of a desired gain factor to be imparted to each of said digital input words, said coefficient word having a predetermined number of bits to provide at an output of said multiplier means, a digital product signal, each word of which having a number of bits equal to the sum of said coefficient word bits and said digital input signal word bits, logic means responsive to said product signal for obtaining at an output, an output signal comprised of output digital words, each having a number of bits equal to the number of bits of said digital input signal words, said logic means being operative to remove all of the least significant bits in said product signal not corresponding to said digital input signal word bits, whereby said output digital words each contain the same number of bits as said input digital word, and such that each of said output digital words include said gain factor, summing means responsive to the output signal from said logic means and said least significant bits and operative to derive an error signal indicative of said least significant bits, feedback control means responsive to said error signal and to the product signal obtained from the next input digital word for adding said error signal to said product signal to provide a compensated digital signal each word of which has the same number of bits as does each word of said product signal, said feedback control means including means for applying said compensated signal to said logic means to cause said logic means to operate on said product signal as compensated by said error signal.

2. The gain control circuit in accordance with claim 1 wherein said digital input signal comprises a PCM signal indicative of said analog signal.

3. The gain control circuit according to claim 1 wherein said analog signal is indicative of an audio signal having a bandwidth for accommodating voice frequencies as necessitated by a telephone system.

4. The gain control circuit according to claim 1 further including a coefficient word generator coupled to said second input of said multiplier means for generating any one of a plurality of selectable coefficient words, each having said predetermined number of bits and differing one from the other by said desired gain factor.

5. The gain control circuit according to claim 1 wherein said analog signal has a frequency range relatively between 0 to 4 KHz, with said digital signal having a word rate relatively between 20 to 50 KHz with the bits in each word being the same and relatively between 10–15 bits per word, with said coefficient word always having the same number of bits between a range of 4 to 10 bits.

6. The gain control circuit in accordance with claim 1 wherein
said digital input signal is derived from the output of an analog to digital converter included in the line circuit of a telephone subscriber in a digital switching telephone system.

7. The gain control circuit in accordance with claim 1 wherein
said logic means responsive to said product signal includes a register operative to store said product signal and means coupled to said register to truncate said least significant bits.

8. The gain control in accordance with claim 1 wherein
said digital input signal is derived at the output of a decimator contained in the transmit path of a digital line circuit associated with a subscriber line in a telephone system.

9. The gain control circuit according to claim 1 wherein
said decimator provides said digital signal having a sampling rate of relatively 30 KHz with each word having the same number of bits, with said number being greater than 10.

10. A gain control circuit for a digital signal of the type comprising a plurality of digital words, each having the same number of bits N, with each word in said signal manifesting a weighted value of an analog signal, comprising:
gain factor means for generating a coefficient word signal, having a given number of bits M, indicative of a desired gain factor to be imparted to each of said digital words,
multiplier means responsive to said digital signal and said coefficient word signal for providing at the output, a digital product signal having a number of bits equal to the sum of M+N,
summing means having one input responsive to said product signal and another input adapted to receive a compensating error signal to provide at an output, a compensated product signal,
logic means coupled to said output of said summing means and adapted to receive said compensated product signal for providing at an output, a gain controlled digital signal comprising the plurality of words in said digital signal, each having the same number of bits, said logic means operative to discard all of said least significant bits from said sum (M+N) not corresponding to said word bits, whereby said output signal contains the same number of words as said digital signal with each word multiplied by said gain factor,
feedback control means coupled to said logic means and responsive to said discarded bits to provide at an output, a compensating error signal indicative of the value of said discarded bits,
means coupled to said another input of said summing means and responsive to said compensated error signal to cause said summing means to add said error signal to the next digital word in said digital signal, whereby said gain controlled digital signal from said logic means manifests an accurate representation of said digital signal having said desired gain factor.

11. The gain control circuit in accordance with claim 10 wherein
said coefficient word signal has a number of bits M equal to 10 bits with said digital signal having a number of bits N equal to 13, and therefore said digital product signal having a number of bits equal to 23.

12. The gain control circuit in accordance with claim 10 wherein
said logic means includes a register for storing said compensated product signal and means coupled to said register for truncating said least significant bits.

13. The gain control circuit in accordance with claim 10 wherein
said digital signal is a PCM signal having a plurality of words, each having a number of bits N with each word manifesting a weighted value obtained from an audio analog signal transmitted in a telephone system.

14. The gain control circuit according to claim 10 wherein
said digital signal is provided on parallel lines, one line for each bit and the bits on said lines at predetermined equal epochs manifesting one word of said signal.

15. A method for applying gain control to a digital signal of the type comprising a plurality of digital words, each having the same number of bits N, with each word in said signal manifesting a weighted value of an analog signal, comprising the steps of:
multiplying said digital signal by a coefficient word signal specifying a predetermined gain factor and having a number of bits M for each digital word signal to provide a product signal for each word with each word of said product signal having a number of bits equal to M+N,
removing the least significant bits from a first product signal indicative of a first digital word to provide an output signal indicative of a first word multiplied by said coefficient word,
adding said removed least significant bits to a product signal indicative of the next digital word to develop a compensated product signal equal to said next product signal having added thereto, said removed bits,
repeating the steps of removing the least significant bits from said compensated product signal to provide a next output signal indicative of the next word, wherein each successive word is modified by an error signal indicative of the removed bits of each prior word to thereby provide an output signal manifesting said input signal multiplied by said predetermined gain factor.

16. The method according to claim 15 wherein the step of removing said least significant bits comprises the steps of:
subtracting said product signal of M+N bits from said output signal of N bits to obtain a signal of M bits, where said M bits are indicative of said least significant bits, and then adding said first signal to the next product signal to develop said compensated signal.

17. The method according to claim 15 wherein
said digital signal is a PCM signal having N bits equal to 13, with a word rate equal to 32 KHz being a signal developed in a digital telephone line circuit.

18. A telephone subscriber line circuit for coupling a subscriber to a digital transmission path in a telephone switching system comprising in combination:
two-to-four wire converter means coupled to a near-end subscriber line to provide a transmit path and a receive path for said line, analog-to-digital converter means for converting near-end analog signals coupled thereto from said two-to-four wire converter in said transmit path, said converter means operative to provide a digital signal comprising a plurality of digital words, each having the same number of bits with each word manifesting a weighted value of said near-end analog signal, transmit gain control means responsive to said digital signal for providing at an output, a compensated digital signal, including means for multiplying said digital signal by a coefficient word signal having a number of bits different than said word bits, to provide at an output, a product signal, means responsive to said product signal to remove all least significant bits, to provide said compensated digital signal of the same bits per word as said original signal, and compensating means for modifying each word of said original digital signal by said least significant bits, to assure said compensated digital signal manifests said original digital signal as modified by said coefficient word signal, means for applying said compensated digital signal to said digital transmission path, means coupled to said digital transmission path adapted to receive a far end digital signal of the same format as said compensated digital signal, receive gain control means responsive to said far end digital signal and operative as said transmit gain control means to provide a far end compensated digital signal in said receive path of said line circuit, digital to analog converter means in said receive path of said line circuit and responsive to said far end compensated signal to provide at an output, a far-end analog signal indicative of said far-end digital signal, and means for coupling said far-end analog signal to said converter to enable a subscriber to receive and transmit via said line circuit, with signals in said receive and transmit paths capable of being gain controlled.

19. The telephone line circuit according to claim 18 wherein
    said gain control means in both said receive and transmit paths is operative over a range of 0-6 db, with an accuracy of at least 0.01 db with an input signal range of said near and far signals of about 45 dbBO.

20. The telephone line circuit according to claim 18 further including
    a decimator coupled to the output of said analog to digital converter in said transmit path for reducing the word rate of said digital signal at said output to provide a decimated digital signal for application to said gain control means.

21. The telephone line circuit according to claim 18 further including
    an interpolator coupled to the output of said receive gain control means for increasing the word rate of said digital signal at the output of said gain control means for application thereto to said digital to analog converter.

22. The telephone line circuit according to claim 18 wherein
    said means for applying said compensated digital signal to said transmission path includes an analog filter.

23. The telephone line circuit according to claim 18 wherein
    said means adapted to receive said far digital signal includes an analog filter.

* * * * *